United States Patent [19]

O'Connor et al.

[11] Patent Number: 4,646,254

[45] Date of Patent: Feb. 24, 1987

[54] NOISE THRESHOLD ESTIMATING METHOD FOR MULTICHANNEL SIGNAL PROCESSING

[75] Inventors: Michael O'Connor, Cupertino; Randall L. Jackson, Fremont; David P. Marple, Palo Alto, all of Calif.

[73] Assignee: GTE Government Systems Corporation, Stamford, Conn.

[21] Appl. No.: 892,453

[22] Filed: Aug. 4, 1986

Related U.S. Application Data

[63] Continuation of Ser. No. 659,056, Oct. 9, 1984, abandoned.

[51] Int. Cl.$^4$ .................. H04B 15/00; G06F 15/20; G06G 7/19
[52] U.S. Cl. .................. 364/574; 307/494; 307/542; 328/162; 364/571
[58] Field of Search ............... 364/514, 570, 571, 572, 364/574, 720, 819, 822; 367/38, 63, 120, 124, 125; 455/296, 303; 307/491, 494, 520, 542; 328/162, 163, 165, 167

[56] References Cited

U.S. PATENT DOCUMENTS

| | | | |
|---|---|---|---|
| 3,731,072 | 5/1973 | Johnston | 364/570 X |
| 3,818,205 | 6/1974 | Wehrmann | 364/570 |
| 4,283,767 | 8/1981 | Rountree | 364/574 |
| 4,520,280 | 5/1985 | Yoshikawa et al. | 328/162 X |
| 4,538,236 | 8/1985 | Dischert et al. | 364/574 |

Primary Examiner—Errol A. Krass
Assistant Examiner—H. R. Herndon
Attorney, Agent, or Firm—Douglas M. Gilbert

[57] ABSTRACT

A noise threshold estimating method for use in a high signal density environment defines a noise threshold level for a plurality of frequency divided channels such that X number of said channels will be defined as being active channels and the remaining channels as being inactive. Using a novel closed loop feedback technique to define a noise threshold level, the noise threshold estimator first compares the signal level of each incoming channel with an analog threshold voltage. A logic device counts the number of active channels and then scales that number according to a predetermined scaling function. The scaled binary number is added with the noise threshold level from the previous clocked interval to define a new noise threshold level. This binary noise threshold level is converted into an analog voltage and feedback to the feedback input of the noise comparison devices to be compared with the signal level of each incoming channel.

4 Claims, 2 Drawing Figures

NOISE THRESHOLD ESTIMATING METHOD FOR MULTICHANNEL SIGNAL PROCESSING

This is a continuation of application Ser. No. 659,056, filed Oct. 9, 1984, now abandoned.

RELATED APPLICATIONS

This invention relates to co-pending patent application Ser. No. 659,055, filed Oct. 9, 1984, entitled "A NOISE THRESHOLD ESTIMATOR FOR MULTI-CHANNEL SIGNAL PROCESSING."

FIELD OF THE INVENTION

The present invention relates in general to electronic signal processing and in particular to a noise threshold detection technique for selecting active channels from a plurality of active and inactive channels.

BACKGROUND OF THE INVENTION

The present invention is intended for use primarily with radio receivers operating in a high-signal-density environment. A Bragg Cell receiver is one type of receiver providing a wideband input and a signal handling capability sufficient to process a multitude of different signal types including radar and communication signals.

The parallel processing of a large number of such channelized signals on a real-time basis often exceeds the capabilities of conventional receivers. In general post detection processing electronics has not kept pace with developments in optical receivers. However, there are some things that can be done to reduce the demands on the signal processor. By limiting the final stages of receiver preprocessing to those channels containing signal information, processing speed and throughput are significantly improved. Such techniques significantly reduce the data rate output of a channelized receiver since the inactive channels can be removed prior to processing. In order to select the active channels from the total number, a noise threshold has to be defined either directly or indirectly and, in such a way to maintain a high probability of capturing the information in the active channels. In order to determine a noise threshold level (which is also called a constant false alarm rate level or simply a CFAR level), there are several common techniques. One method involves performing an FFT (fast Fourier Transform) on the guardbands of a signal. In the frequency domain, these guardbands lie on either side of the peak signal, and from these the noise level can be extracted. Another way is the rank select threshold method. Finally, should noise display a spectrum resembling a Gaussian distribution (as it often does), statistical techniques for determining noise can be employed.

There are trade-offs to be made in each of these techniques. For a system with a large number of channels, the guardband and rank select threshold methods prove to be complicated to implement since each frequency path requires its own rather complicated circuitry. Statistical methods present problems in real-time applications since the algorithms they utilize are complicated and time consuming.

In view of the foregoing, a principle object of the present invention is the provision of a data reduction technique that uses the total signal level in all incoming channels to determine the number of channels above and below a noise threshold level.

A further object of this invention is the provision of an adaptive noise threshold estimating technique that allows for continuously changing noise threshold levels to follow changing signal and noise levels in incoming channels.

Still another object is the provision of a very stable and accurate method of estimating the wideband noise level which changes as the noise in the environment changes.

SUMMARY OF THE INVENTION

These and other objects and advantages are achieved with the present signal processing method. Briefly, there is provided a signal processing technique for determining a noise threshold level for a plurality of N frequency divided analog channels such that X analog channels are above the noise threshold level and N−X analog channels are below the noise threshold level. The signal processing technique receives a plurality of N signal input channels from a receiver that channelizes a wideband spectrum and detects the signals in each channel. The N signal inputs are compared with the signal level of a feedback signal, the feedback signal being the computed noise threshold signal. The threshold comparison provides at each of N outputs at predetermined intervals of time a first state binary signal (a 1) if the signal level at the corresponding signal input is above the level of the noise threshold signal, and a second state binary signal (a 0) if the signal level at the corresponding signal input is below the level of the noise threshold signal. The binary signals at said first state during the selected time intervals are added together, and then are scaled by a predetermined scaling function to produce a second binary signal. Using this second binary signal, a digital noise threshold signal is generated during each selected interval of time by adding the second binary signal and the digital noise threshold signal from the previously selected interval. Then a digital-to-analog converter converts the digital noise threshold signal into an analog noise threshold signal which is applied to the feedback input of the threshold comparison devices.

BRIEF DESCRIPTION OF THE DRAWINGS

The above and other objects, features and advantages of the present invention will become apparent from the following description of the accompanying drawings in which.

DESCRIPTION OF PREFERRED EMBODIMENT

Figure 1:
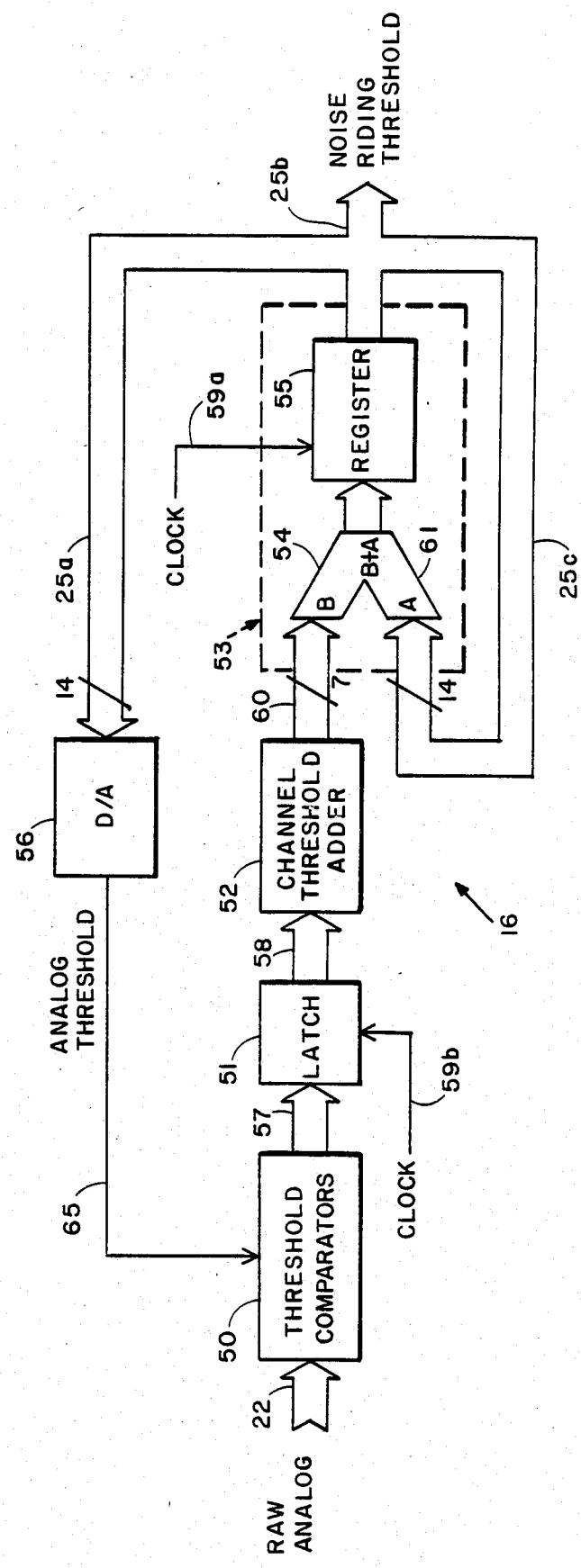
FIG. 1 is a simplified block diagram of the preferred embodiment of a noise threshold estimator.

Referring to FIG. 1, there is shown a functional block diagram having a plurality (N) of input signal lines indicated generally by a signal bus 22 and also designated "raw analog". The source of each input line is the output of a channelized radio receiver or optical processor (not shown) such as a Bragg Cell. Such receivers divide up a wideband RF spectrum (e.g. 1–2 GHz) into individual frequency separated channels (e.g. 100 channels each 10 MHz wide). The baseband signals in each channel are demodulated and applied as a voltage to the analog bus 22.

Figure 2:
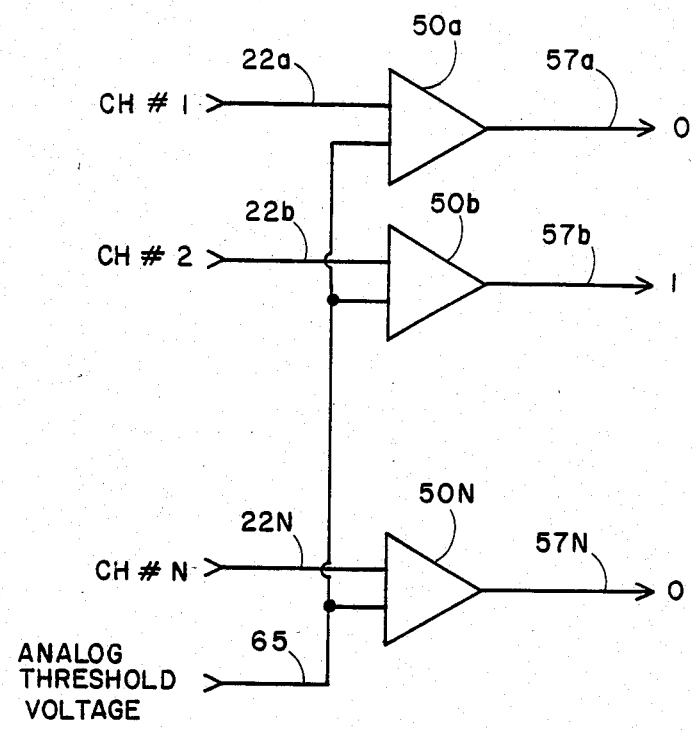
FIG. 2 is a schematic diagram showing a digital threshold comparator (50).

The raw analog bus 22 is applied to threshold comparators 50 (which are shown in more detail in FIG. 2). The function of comparators 50 is to compare the signal level of each input channel with the signal level of a reference signal applied via path 65. For each channel that carries a higher signal level than the analog threshold voltage, a binary 1 is generated on its corresponding output path 57. And, for each channel that carries a lower signal level than the analog threshold voltage, a binary 0 is generated on its corresponding output path 57. There is a one to one correspondence between the raw analog input channels 22 and the output channels 57 of the comparators 50. (The threshold comparators 50 in FIG. 1 could be implemented with the circuit shown in FIG. 2 where 50a, 50b, and 50N are op amps having a speed and bandwidth consistent with the speed of operation of the rest of the system.) All of the N output signals are clocked in parallel through data latch 51 to a channel threshold adder 52 via bus 58. Path 59b applies a clock signal from a timing circuit (not shown) to trigger latch 51 on the leading edge of the clock pulse. Adder 52 totals the number of input signals on path 58 containing a binary 1, converts that number to a scaled digital signal, and applies the result as a 7-bit byte to the B input of adder 54. The output of adder 54 on path 61 is a 14-bit byte that is latched (via register 55) to the main output path 25. This output signal, which is referred to herein as a noise riding threshold, is fedback via path 25a to digital-to-analog converter 56 and is also fedback via path 25c to the A input of adder 54. Path 59a applies a clock signal from the same timing circuit (not shown) to trigger register 55 on the trailing edge of each clock pulse. The end product of this apparatus is the noise riding threshold voltage riding on path 25b. Path 25b distributes this signal to auxiliary circuits that select out the desired channels and dump the inactive channels.

In the preferred embodiment the channel threshold adder 52 is implemented with a digital adder circuit and a PROM look up table. The total number of channels above threshold, i.e. the number having a binary 1 at the input to the adder, serves as an index into a table containing the function $f(n) = A(n-X)$, where the variable n is the actual number of channels above the noise threshold and X is the desired number of channels to be above the noise threshold. Certainly there are any number of functions (linear, nonlinear, and discontinuous) that could be used to scale the number of channels depending upon a multitude of considerations and features desired, such as the degree of control desired or the speed at which the function converges to the desired number.

The functional operation of the threshold estimator shown in FIG. 1 is as follows. The integrator 53 combines the current calculated threshold with the previous threshold level to generate a new threshold level. So when the system is first activated, the analog threshold voltage on path 65 is at zero volts and the correction factor on path 60 is at its maximum. This is shown in the example illustrated in the table below by the first row of numbers. Conversely when none of the channels is above the threshold, the correction factor is at a minimum, i.e. −300 in the example below.

The easiest way to appreciate the operation of the noise threshold estimator shown in FIG. 1 is to follow through a typical example of its operation when first powered on. The table below assumes that the total number of channels N is 100 and the desired number of active channels to be above the noise threshold X is 50. The column headings are self-explanatory.

| Register 55 Output Path 25 (binary) | Analog Threshold Voltage Path 65 (Volts) | Channels Above Threshold (n) Path 57 (#) | PROM Output (fn) Path 60 (binary) | Adder Output Path 61 (binary) |
|---|---|---|---|---|
| 0 | 0 | 100 | 300 | 300 |
| 300 | 3.0 | 80 | 180 | 480 |
| 480 | 4.8 | 60 | 60 | 540 |
| 540 | 5.4 | 45 | −30 | 510 |
| 510 | 5.1 | 48 | −12 | 498 |
| 498 | 4.98 | 51 | 6 | 504 |
| 504 | 5.04 | 50 | 0 | 504 |

When the power is first applied, path 25 and 65 are at 0 level. Consequently all 100 channels are above the 0 volt threshold and the channel threshold adder 52 generates its highest possible output on path 60 which is 300. (In the preferred embodiment this binary number is generated in a 2's complement code.) This number is added to the previous noise level on path 25c, i.e. 0, so the output of the adder 54 on path 61 is 300.

The noise level of 300 on path 61 is latched through to path 25 and is then converted to a +3.0 V on path 65 (line 2 in the table). With 3.0 V as a noise threshold the second iteration begins and only 80 channels are found to be above this level by the threshold comparators 50. The 80-channel number above is translated into a new PROM output, 180, on path 60. The binary number 180 (in 2's complement) is added with the previous threshold value of 300 on path 25c to produce a binary number of 480 on path 61. And as is shown by the example in the table above, the analog threshold voltage finally converges to a value of 5.04 V so that 50 channels are above threshold. (In certain applications it may be desireable to increase the stability of the overall detector by having the PROM set to output a 0 level when n is within ±1 of X.)

Thus this feedback apparatus functions to maintain the output digital CFAR threshold word at a value where X channels are above threshold. This provides a very stable, accurate estimate of the noise level which changes as the noise in the environment changes. The bandwidth of the FAR loop $f_L$ should be much less than the noise bandwidth $f_N$ of a single channel. This allows the loop to settle on an average value of noise rather than follow a transient noise waveform. The sample bandwidth $f_s$ should be reduced as far as possible without causing spectrum foldover and aliasing.

While a preferred embodiment of the present invention is disclosed and described above, it is contemplated that those skilled in the art may make numerous changes thereto without departing from the spirit and scope thereof. For example, it is intended that the present invention be embodied in discrete components as explained above, however, it is possible that the entire process be performed by a microprocessor or in a programmable digital computer-type apparatus. For these reasons, it is intended that the present invention not be limited to the embodiment described above, but rather be determined solely by reference to the claims hereinafter provided.

What is claimed is:

1. A signal processing method for determining a noise threshold signal for a plurality of N analog channels such that the signal level of X analog channels is above the level of the noise threshold signal and the signal level of N-X analog channels is below the level of the noise threshold signal, said processing method comprising the steps of:

(1) comparing the signal level of each N analog channels with the signal level of an applied feedback signal and providing at separate outputs during selected intervals of time: a first state binary signal if the signal level of the corresponding analog channel is above the signal level of the feedback signal, and a second state binary signal if the signal level of the corresponding analog channel is below the signal level of the feedback signal;

(2) adding the number of first state binary signals during each selected interval of time and scaling said added number during each selected interval by a predetermined scaling function to produce a scaled binary signal;

(3) generating a digital noise threshold signal during each selected interval of time by adding said scaled binary signal to the digital noise threshold signal from the previous selected interval of time;

(4) converting said digital noise threshold signal into a corresponding analog noise threshold signal and feeding back said analog noise threshold signal (which is said applied feedback signal) for comparison with each of said N channels during the next selected time interval; and, (5) repeating steps (1)-(4) so that the signal level X analog channels is above the noise threshold level and the signal level of N−X analog channels is below the noise threshold level.

2. A method according to claim 1 wherein said plurality of N analog channels are frequency divided.

3. A method according to claim 2 wherein said scaling function corresponds to a function f(n):

that is negative and goes to zero as n approaches the number X for all n in the range $0 \leq n \leq X$;

that is equal to 0 for n=X; and that is positive and goes to zero as n approaches X for all n in the range $X < n \leq N$.

4. A method according to claim 2 wherein said scaling function corresponds to a function f(n):

that is negative and goes to zero as n approaches the number X for all n in the range $0 \leq n < (X-1)$;

that is equal to 0 for all n in the range $(X-1) \leq n \leq (X+1)$; and that is positive and goes to zero as n approaches X for all n in the range $(X+1) < n \leq N$.

* * * * *